US006447977B2

(12) United States Patent

Vermeersch et al.

(10) Patent No.: US 6,447,977 B2
(45) Date of Patent: *Sep. 10, 2002

(54) HEAT MODE SENSITIVE IMAGING ELEMENT FOR MAKING POSITIVE WORKING PRINTING PLATES

(75) Inventors: Joan Vermeersch, Deinze; Marc Van Damme, Heverlee; Eric Verschueren, Merksplas; Guido Hauquier, Nijlen, all of (BE)

(73) Assignee: Agfa-Gevaert, Mortsel (BE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/260,062

(22) Filed: Mar. 2, 1999

Related U.S. Application Data

(60) Provisional application No. 60/089,287, filed on Jun. 15, 1998.

(30) Foreign Application Priority Data

Apr. 15, 1998 (EP) ........................................... 98201216

(51) Int. Cl.[7] ............................................... G03F 7/039

(52) U.S. Cl. ............................... 430/270.1; 430/278.1; 430/302; 430/348; 430/944; 430/945; 430/964; 101/453; 101/463.1

(58) Field of Search ............................. 430/270.1, 302, 430/278.1, 348, 944, 945, 964; 101/453, 463.1, 465, 457

(56) References Cited

U.S. PATENT DOCUMENTS

| | | | | |
|---|---|---|---|---|
| 5,536,619 A | * | 7/1996 | Verburgh | 430/273.1 |
| 5,620,819 A | * | 4/1997 | Conforti et al. | 430/14 |
| 5,840,467 A | * | 11/1998 | Kitatani et al. | 430/302 |
| 5,858,604 A | * | 1/1999 | Takeda et al. | 430/162 |
| 6,004,728 A | * | 12/1999 | Deroover et al. | 430/302 |
| 6,060,218 A | * | 5/2000 | Van Damme et al. | 430/302 |
| 6,074,802 A | * | 6/2000 | Murata et al. | 430/270.1 |
| 6,083,662 A | * | 7/2000 | Miller et al. | 430/302 |
| 6,090,532 A | * | 7/2000 | West et al. | 430/326 |
| 6,235,451 B1 | * | 5/2001 | Damme et al. | 430/302 |
| 6,280,899 B1 | * | 8/2001 | Parsons et al. | 430/270.1 |

FOREIGN PATENT DOCUMENTS

| | | | |
|---|---|---|---|
| EP | 0 823 327 A2 | | 2/1998 |
| EP | 0 864 420 A1 | | 9/1998 |
| GB | 1 208 415 | | 10/1970 |
| GB | 1 245 924 | | 9/1971 |
| JP | 2000056448 A | * | 2/2000 |

OTHER PUBLICATIONS

Patent Abstracts of Japan, vol. 014, No. 199 (P–1040), Apr. 23, 1990 & JP 02 040659 A (Fuji Photo Film Co. Ltd.), Feb. 9, 1990.

Patent Abstracts of Japan, vol. 016, No. 169 (M–1239), Apr. 23, 1992 & JP 04 014481 A (Oji Paper Co. Ltd.), Jan. 20, 1992.

* cited by examiner

*Primary Examiner*—Rosemary Ashton
*Assistant Examiner*—Barbara Gilmore
(74) *Attorney, Agent, or Firm*—Breiner & Breiner, L.L.C.

(57) ABSTRACT

According to the present invention there is provided a heat mode imaging element for making a lithographic printing plate having on a lithographic base with a hydrophilic surface a first layer including a polymer soluble in an aqueous alkaline solution, and a top layer on the same side of the lithographic base as the first layer that is IR-sensitive and unpenetrable for an aqueous alkaline developer wherein said first layer and said top layer may be one and the same layer; characterized in that the surface of said element upon exposure and treatment with an aqueous alkaline developer is such that a) the contact angle between the unexposed areas of the imaging element and the aqueous alkaline developer changes for at most 6° during the first minute of contact with said developer;

b) the contact angle between the exposed areas of the imaging element and the aqueous alkaline developer changes more than 15° during the first minute of contact with said developer;

c) the difference in contact angle between on the one side the unexposed areas and on the other side the exposed areas of the imaging element with the aqueous alkaline solution at the onset of the measurement is not higher than 10°.

11 Claims, No Drawings

HEAT MODE SENSITIVE IMAGING ELEMENT FOR MAKING POSITIVE WORKING PRINTING PLATES

This application claims the benefit of U.S. provisional application No. 60/089,287, filed Jun. 15, 1998.

FIELD OF THE INVENTION

The present invention relates to a heat mode imaging element for preparing a lithographic printing plate.

More specifically the invention is related to a heat mode imaging element for preparing a lithographic printing plate whereof the difference in the top layer of being penetrated and/or solubilised in the exposed areas and in the non-exposed areas by an aqueous developer is increased.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are camera-exposed through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the photosensitive coating is not sensitive enough to be directly exposed with a laser. Therefor it has been proposed to coat a silver halide layer on top of the photosensitive coating. The silver halide may then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A-60-61 752 but has the disadvantage that a complex development and associated developing liquids are needed.

GB-1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat mode printing plate precursors is clearly seen on the market.

For example, Research Disclosure no. 33303 of January 1992 discloses a heat mode imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink-acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

U.S. Pat. No. 4,708,925 discloses imaging elements including a photosensitive composition comprising an alkali-soluble novolac resin and an onium-salt. This composition may optionally contain an IR-sensitizer. After image-wise exposing said imaging element to UV- visible— or IR-radiation followed by a development step with an aqueous alkali liquid there is obtained a positive or negative working printing plate. The printing results of a lithographic plate obtained by irradiating and developing said imaging element are poor.

EP-A-625 728 discloses an imaging element comprising a layer which is sensitive to UV- and IR-irradiation and which may be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625 728 but discloses the method for obtaining a negative working IR-laser recording imaging element. The IR-sensitive layer comprises a resole resin, a novolac resin, a latent Bronsted acid and an IR-absorbing substance. The printing results of a lithographic plate obtained by irradiating and developing said imaging element are poor.

Furthermore EP-A-678 380 discloses a method wherein a protective layer is provided on a grained metal support underlying a laser-ablatable surface layer. Upon image-wise exposure the surface layer is fully ablated as well as some parts of the protective layer. The printing plate is then treated with a cleaning solution to remove the residu of the protective layer and thereby exposing the hydrophilic surface layer.

EP-A-97 200 588.8 discloses a heat mode imaging element for making lithographic printing plates comprising on a lithographic base having a hydrophilic surface an intermediate layer comprising a polymer, soluble in an aqueous alkaline solution and a top layer that is sensitive to IR-radiation wherein said top layer upon exposure to IR-radiation has a decreased or increased capacity for being penetrated and/or solubilised by an aqueous alkaline solution.

EP-A-97 203 129.8 and EP-A-97 203 132.2 disclose a heat mode imaging element consisting of a lithographic base with a hydrophilic surface and a top layer which top layer is sensitive to IR-radiation, comprises a polymer, soluble in an aqueous alkaline solution and is unpenetrable for an alkaline developer containing $SiO_2$ as silicates Said last three heat-mode imaging element have the disadvantage that the difference between the solubility in the exposed areas and in the non-exposed aqreas is not very great so that also non-exposed areas are dissolved during the processing of said element so that said plates could not be used as lithographic plates.

OBJECTS OF THE INVENTION

It is an object of the invention to provide a heat mode imaging element for making in an easy way lithographic printing plates.

It is another object of the invention to provide a heat mode sensitive imaging element for making positive lithographic printing plates having excellent printing properties, developable in a selective, rapid, convenient and ecological way.

It is further an object of the present invention to provide a heat mode sensitive imaging element having a high infrared sensitivity.

It is also an object of the present invention to provide a heat mode sensitive imaging element which has a great difference in developability in a developer between the exposed areas and the non-exposed areas.

Further objects of the present invention will become clear from the description hereinafter.

SUMMARY OF THE INVENTION

According to the present invention there is provided a heat mode imaging element for making a lithographic printing plate having on a lithographic base with a hydrophilic surface a first layer including a polymer soluble in an aqueous alkaline solution, and a top layer on the same side of the lithographic base as the first layer that is IR-sensitive and unpenetrable for an aqueous alkaline developer wherein said first layer and said top layer may be one and the same layer; characterized in that the surface of said element upon exposure and treatment with an aqueous alkaline developer is such that a) the contact angle between the unexposed areas of the imaging element and the aqueous alkaline developer changes for at most 6° during the first minute of contact with said developer;

b) the contact angle between the exposed areas of the imaging element and the aqueous alkaline developer changes more than 15° during the first minute of contact with said developer;

c) the difference in contact angle between on the one side the unexposed areas and on the other side the exposed areas of the imaging element with the aqueous alkaline solution at the onset of the measurement is not higher than 10°.

DETAILED DESCRIPTION OF THE INVENTION

The top layer is also called the second layer.

The contact angle is measured with a contact angle goniometer.

The contact angle between the unexposed areas of the imaging element and the aqueous alkaline solution at the onset of the measurement is preferably at least 100°. The change in contact angle between the exposed areas of the imaging element and the aqueous alkaline developer after the first minute of contact is preferably higher than 20°, more preferably higher than 25°.

In a first embodiment the first layer and the top layer are different. In said embodiment there is provided a heat mode imaging element for making lithographic printing plates having on a lithographic base with a hydrophilic surface a first layer including a polymer, soluble in an aqueous alkaline solution and a top layer on the same side of the lithographic base as the first layer which top layer is sensitive to IR-radiation and which is unpenetrable for an alkaline developer.

The top layer, in accordance with the present invention comprises an IR-dye or pigment and a binder resin. A mixture of IR-dyes or pigments may be used, but it is preferred to use only one IR-dye or pigment. Preferably said IR-dyes are IR-cyanines dyes. Particularly useful IR-cyanine dyes are cyanines dyes with two indolenine groups. Most preferably is compound I with the structure as indicated (I)

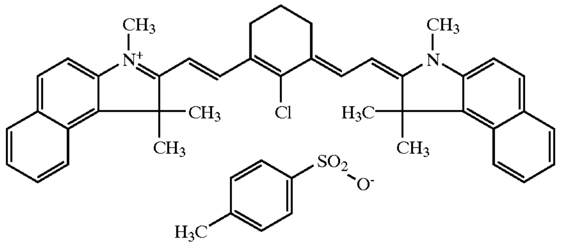

Particularly useful IR-absorbing pigments are carbon black, metal carbides, borides, nitrides, carbonitrides, bronze-structured oxides and oxides structurally related to the bronze family but lacking the A component e.g. WO2.9. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

The IR-absorbing dyes or pigments are present preferably in an amount between 1 and 99 parts, more preferably between 50 and 95 parts by weight of the total amount of said IR-sensitive top layer.

The top layer may preferably comprise as binder a water insoluble polymer such as a cellulose ester, a copolymer of vinylidene chloride and acrylonitrile, poly(meth)acrylates, polyvinyl chloride, silicone resins, etc. Preferred as binder is nitrocellulose resin.

The total amount of the top layer preferably ranges from 0.05 to 10 $g/m^2$, more preferably from 0.1 to 2 $g/m^2$.

In the top layer a difference in the capacity of being penetrated and/or solubilised by the aqueous alkaline solution is generated upon image-wise exposure for an alkaline developer according to the invention.

In the present invention the said capacity is increased upon image-wise IR exposure to such degree that the imaged parts will be cleaned out during development without solubilising and/or damaging the non-imaged parts.

The development with the aqueous alkaline solution is preferably done within an interval of 5 to 120 seconds.

Between the top layer and the lithographic base the present invention comprises a first layer soluble in an aqueous alkaline developing solution with preferentially a pH between 7.5 and 14. Said layer is preferably contiguous to the top layer but other layers may be present between the top layer and the first layer. The alkali soluble binders used in this layer are preferably hydrophobic binders as used in conventional positive or negative working PS-plates e.g. novolac polymers, polymers containing hydroxystyrene units, carboxy substituted polymers etc. Typical examples of these polymers are described in DE-A-4 007 428, DE-A-4 027 301 and DE-A-4 445 820. The hydrophobic binder used in connection with the present invention is further characterised by insolubility in water and partial solubility/swellability in an alkaline solution and/or partial solubility in water when combined with a cosolvent.

Furthermore this aqueous alkali soluble layer is preferably a visible light- and UV-light desensitised layer. Said layer is preferably thermally hardenable. This preferably visible light- and UV-desensitised layer does not comprise photosensitive ingredients such as diazo compounds, photoacids, photoinitiators, quinone diazides, sensitisers etc. which absorb in the wavelength range of 250 nm to 650 nm. In this way a daylight stable printing plate may be obtained.

Said first layer preferably also includes a low molecular acid, preferably a carboxylic acid, still more preferably a benzoic acid, most preferably 3,4,5-trimethoxybenzoic acid or a benzophenone.

The ratio between the total amount of low molecular acid or benzophenone and polymer in the first layer preferably ranges from 2:98 to 40:60, more preferably from 5:95 to 20:80. The total amount of said first layer preferably ranges from 0.1 to 10 $g/m^2$, more preferably from 0.3 to 2 $g/m^2$.

In the imaging element according to the present invention, the lithographic base may be an anodised aluminum for all embodiments. A particularly preferred lithographic base is an electrochemically grained and anodised aluminum support. The anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another mode in connection with the present invention, the lithographic base having a hydrophilic surface comprises a flexible support, such as e.g. paper or plastic film, provided with a cross-linked hydrophilic layer for all embodiments. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, more preferably between 0.5 and 5 parts by weight, most preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica may be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A-601 240, GB-P-1 419 512, FR-P-2 300 354, U.S. Pat. No. 3,971,660, U.S. Pat. No. 4,284,705 and EP-A-514 490.

As flexible support of a lithographic base in connection with the present embodiment it is particularly preferred to use a plastic film e.g. substrated polyethylene terephthalate film, substrated polyethylene naphthalate film, cellulose acetate film, polystyrene film, polycarbonate film etc. The plastic film support may be opaque or transparent.

It is particularly preferred to use a polyester film support to which an adhesion improving layer has been provided.

Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

In a second embodiment the first layer and the second layer are the same. In said embodiment there is provided a heat mode imaging element for making lithographic printing plates having on a lithographic base with a hydrophilic surface a top layer which top layer is sensitive to IR-radiation, comprises a polymer, soluble in an aqueous alkaline solution and is unpenetrable for an alkaline developer.

The IR-sensitive layer, in accordance with the present invention comprises an IR-dye or pigment and a polymer, soluble in an aqueous alkaline solution. A mixture of IR-dyes or pigments may be used, but it is preferred to use only one IR-dye or pigment. Suitable IR-dyes and pigments are those mentioned above in the first embodiment of the present invention.

The IR-dyes are present preferably in an amount between 1 and 60 parts, more preferably between 3 and 50 parts by weight of the total amount of said IR-sensitive top layer.

The alkali soluble polymers used in this layer are preferably hydrophobic and ink accepting polymers as used in conventional positive or negative working PS-plates e.g. carboxy substituted polymers etc. More preferably is a phenolic resin such as a hydroxystyrene units containing polymer or a novolac polymer. Most preferred is a novolac polymer. Typical examples of these polymers are described in DE-A-4 007 428, DE-A-4 027 301 and DE-A-4 445 820. The hydrophobic polymer used in connection with the present invention is further characterised by insolubility in water and at least partial solubility/swellability in an alkaline solution and/or at least partial solubility in water when combined with a cosolvent.

Furthermore this IR-sensitive layer is preferably a visible light- and UV-light desensitised layer. Still further said layer is preferably thermally hardenable. This preferably visible light- and UV-light desensitised layer does not comprise photosensitive ingredients such as diazo compounds, photoacids, photoinitiators, quinone diazides, sensitisers etc. which absorb in the wavelength range of 250 nm to 650 nm. In this way a daylight stable printing plate may be obtained.

Said IR-sensitive layer preferably also includes a low molecular acid, more preferably a carboxylic acid, still more preferably a benzoic acid, most preferably 3,4,5-trimethoxybenzoic acid or a benzofenone, more preferably trihydroxybenzofenone.

The ratio between the total amount of low molecular acid or benzofenone and polymer in the IR-sensitive layer preferably ranges from 2:98 to 40:60, more preferably from 5:95 to 30:70. The total amount of said IR-sensitive layer preferably ranges from 0.1 to 10 g/$m^2$, more preferably from 0.3 to 2 g/$m^2$.

In the IR-sensitive layer a difference in the capacity of being penetrated and/or solubilised by the alkaline developer is generated upon image-wise exposure for an alkaline developer according to the invention.

To prepare a lithographic plate, the heat-mode imaging element is image-wise exposed and developed.

Image-wise exposure in connection with the present invention is an image-wise scanning exposure involving the use of a laser that operates in the infrared or near-infrared, i.e. wavelength range of 700–1500 nm. Most preferred are laser diodes emitting in the near-infrared. Exposure of the imaging element may be performed with lasers with a short as well as with lasers with a long pixel dwell time. Preferred are lasers with a pixel dwell time between 0.005 $\mu$s and 20 $\mu$s.

After the image-wise exposure the heat mode imaging element is developed by rinsing it with an aqueous alkaline solution. The aqueous alkaline solutions used in the present invention are those that are used for developing conventional positive working presensitised printing plates, preferably containing $SiO_2$ in the form of silicates and having preferably a pH between 11.5 and 14. Thus the imaged parts of the top layer that were rendered more penetrable for the aqueous alkaline solution upon exposure are cleaned-out whereby a positive working printing plate is obtained.

In the present invention, the composition of the developer used is also very important.

Therefore, to perform development processing stably for a long time period particularly important are qualities such as strength of alkali and the concentration of silicates in the developer. Under such circumstances, the present inventors have found that a rapid high temperature processing can be performed, that the amount of the replenisher to be supplemented is low and that a stable development processing can be performed over a long time period of the order of not less than 3 months without exchanging the developer only when the developer having the foregoing composition is used.

The developers and replenishers for developer used in the invention are preferably aqueous solutions mainly composed of alkali metal silicates and alkali metal hydroxides represented by MOH or their oxyde, represented by $M_2O$, wherein said developer comprises $SiO_2$ and $M_2O$ in a molar ratio of 0.5 to 1.5 and a concentration of $SiO_2$ of 0.5 to 5% by weight. As such alkali metal silicates, preferably used are, for instance, sodium silicate, potassium silicate, lithium silicate and sodium metasilicate. On the other hand, as such alkali metal hydroxides, preferred are sodium hydroxide, potassium hydroxide and lithium hydroxide.

The developers used in the invention may simultaneously contain other alkaline agents. Examples of such other alkaline agents include such inorganic alkaline agents as ammonium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate and ammonium carbonate; and such organic alkaline agents as mono-, di- or triethanolamine, mono-, di- or trimethylamine, mono-, di- or triethylamine, mono- or diisopropylamine, n-butylamine, mono-, di- or triisopropanolamine, ethyleneimine, ethylenediimine and tetramethylammonium hydroxide.

In the present invention, particularly important is the molar ratio in the developer of $[SiO_2]/[M_2O]$, which is generally 0.6 to 1.5, preferably 0.7 to 1.3. This is because if the molar ratio is less than 0.6, great scattering of activity is observed, while if it exceeds 1.5, it becomes difficult to perform rapid development and the dissolving out or removal of the light-sensitive layer on non-image areas is liable to be incomplete. In addition, the concentration of $SiO_2$ in the developer and replenisher preferably ranges from 1 to 4% by weight. Such limitation of the concentration of $SiO_2$ makes it possible to stably provide lithographic printing plates having good finishing qualities even when a large amount of plates according to the invention are processed for a long time period.

In a particular preferred embodiment, an aqueous solution of an alkali metal silicate having a molar ratio $[SiO_2]/[M_2O]$, which ranges from 1.0 to 1.5 and a concentration of $SiO_2$ of 1 to 4% by weight is used as a developer. In such case, it is a matter of course that a replenisher having alkali strength equal to or more than that of the developer is employed. In order to decrease the amount of the replenisher to be supplied, it is advantageous that a molar ratio, $[SiO_2]/[M_2O]$, of the replenisher is equal to or smaller than that of the developer, or that a concentration of $SiO_2$ is high if the molar ratio of the developer is equal to that of the replenisher.

In the developers and the replenishers used in the invention, it is possible to simultaneously use organic solvents having solubility in water at 20° C. of not more than 10% by weight according to need. Examples of such organic solvents are such carboxilic acid esters as ethyl acetate, propyl acetate, butyl acetate, amyl acetate, benzyl acetate, ethylene glycol monobutyl acetate, butyl lactate and butyl levulinate; such ketones as ethyl butyl ketone, methyl isobutyl ketone and cyclohexanone; such alcohols as ethylene glycol monobutyl ether, ethylene glycol benzyl ether, ethylene glycol monophenyl ether, benzyl alcohol, methylphenylcarbinol, n-amyl alcohol and methylamyl alcohol; such alkyl-substituted aromatic hydrocarbons as xylene; and such halogenated hydrocarbons as methylene dichloride and monochlorobenzene. These organic solvents may be used alone or in combination. Particularly preferred is benzyl alcohol in the invention. These organic solvents are added to the developer or replenisher therefor generally in an amount of not more than 5% by weight and preferably not more than 4% by weight.

The developers and replenishers used in the present invention may simultaneously contain a surfactant for the purpose of improving developing properties thereof. Examples of such surfactants include salts of higher alcohol ($C_8$~$C_{22}$) sulfuric acid esters such as sodium salt of lauryl alcohol sulfate, sodium salt of octyl alcohol sulfate, ammonium salt of lauryl alcohol sulfate, Teepol B-81 (trade mark, available from Shell Chemicals Co., Ltd.) and disodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnaphthalene sulfonate,sodium salt of dinaphthalene disulfonate and sodium salt of metanitrobenzene sulfonate; sulfonic acid salts of alkylamides such as $C_{17}H_{33}CON(CH_3)CH_2CH_2SO_3Na$ and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactants may be used in an amount of generally not more than 5% by weight and preferably not more than 3% by weight.

In order to enhance developing stability of the developers and replenishers used in the invention, the following compounds may simultaneously be used.

Examples of such compounds are neutral salts such as NaCl, KCl and KBr as disclosed in JN-A-58-75 152; chelating agents such as EDTA and NTA as disclosed in JN-A-58-190 952 (U.S. Pat. No. 4,469,776), complexes such as $[Co(NH_3)_6]Cl_3$ as disclosed in JN-A-59-121 336 (U.S. Pat. No. 4,606,995); ionizable compounds of elements of the group IIa, IIIa or IIIb of the Periodic Table such as those disclosed in JN-A-55-25 100; anionic or amphoteric surfactants such as sodium alkyl naphthalene sulfonate and N-tetradecyl-N,N-dihydroxythyl betaine as disclosed in JN-A-50-51 324; tetramethyldecyne diol as disclosed in U.S. Pat. No. 4,374,920; non-ionic surfactants as disclosed in JN-A-60-213 943; cationic polymers such as methyl chloride quaternary products of p-dimethylaminomethyl polystyrene as disclosed in JN-A-55-95 946; amphoteric polyelectrolytes such as copolymer of vinylbenzyl trimethylammonium chloride and sodium acrylate as disclosed in JN-A-56-142 528; reducing inorganic salts such as sodium sulfite as disclosed in JN-A-57-192 952 (U.S. Pat. No. 4,467,027) and alkaline-soluble mercapto compounds or thioether compounds such as thiosalicylic acid, cysteine and thioglycolic acid; inorganic lithium compounds such as lithium chloride as disclosed in JN-A-58-59 444; organic lithium compounds such as lithium benzoate as disclosed in JN-A-50 34 442; organometallic surfactants containing Si, Ti or the like as disclosed in JN-A-59-75 255; organoboron compounds as disclosed in JN-A-59-84 241 (U.S. Pat. No. 4,500,625); quaternary ammonium salts such as tetraalkylammonium oxides as disclosed in EP-A-101 010; and bactericides such as sodium dehydroacetate as disclosed in JN-A-63-226 657.

In the method for development processing of the present invention, any known means of supplementing a replenisher for developer may be employed. Examples of such methods preferably used are a method for intermittently or continuously supplementing a replenisher as a function of the amount of PS plates processed and time as disclosed in JN-A-55-115 039 (GB-A-2 046 931), a method comprising disposing a sensor for detecting the degree of light-sensitive layer dissolved out in the middle portion of a developing zone and supplementing the replenisher in proportion to the detected degree of the light-sensitive layer dissolved out as disclosed in JN-A-58-95 349 (U.S. Pat. No. 4,537,496); a method comprising determining the impedance value of a developer and processing the detected impedance value by a computer to perform supplementation of a replenisher as disclosed in GB-A-2 208 249.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in "Grafisch Nieuws" ed. Keesing, 15, 1995, page 4 to 6.

After the development of an image-wise exposed imaging element with an aqueous alkaline solution and drying, the obtained plate can be used as a printing plate as such. However, to improve durability it is still possible to bake said plate at a temperature between 200° C. and 300° C. for a period of 30 seconds to 5 minutes. Also the imaging element can be subjected to an overall post-exposure to UV-radiation to harden the image in order to increase the run length of the printing plate.

The following examples illustrate the present invention without limiting it thereto. All parts and percentages are by weight unless otherwise specified.

EXAMPLE 1

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m2 to form a surface topography with an average center-line roughness Ra of 0.5 μm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density 10 of 150 A/$m^2$ for about 300 seconds to form an anodic oxidation film of 3.00 g/$m^2$ of $Al_2O_3$ then washed with demineralized water, posttreated with a solution containing polyvinylphosphonic acid and subsequently with a solution containing aluminum trichloride, rinsed with demineralized water at 20° C. during 120 seconds and dried.

Preparation of the Heat-mode Imaging Element

On the above described lithographic base was first coated a layer from a 8.6% wt solution in tetrahydrofuran/methoxypropanol 55/45 ratio, with a wet coating thickness of 14 μm. The resulting layer contained 88% of ALNOVOL SPN452™ (novolac available from Clariant, Germany) and 12% of 3,4,5-trimethoxybenzoic acid. Upon this layer was then coated with a wet coating thickness of 20 μm, the IR-sensitive layer from a 0.81% wt solution in methylethylketone/methoxypropanol 50/50 ratio. The resulting IR-sensitive layer contained 81.5% of carbon black, 8.2% of nitrocellulose and 10.3% of FLUORAD FC431™ (a perfluoroalkyl surfactant of 3M, USA).

Exposing the Heat-mode Imaging Element

This material was imaged with a CREO 3244 TRENDSETTER™ (available from Creo) external drum platesetter at 240 mJ/$cm^2$ and 2400 dpi, under non-ablative conditions.

Developing and Printing the Imagewise Exposed Element

The exposed material was developed in an aqueous alkaline developing solution. These developing was carried out in a TECHNIGRAPH NPX-32™ (available from Technigraph)processor filled with OZASOL EP26™ developer/water 4/1 ratio (OZASOL EP26 is commercially available from Agfa) in the developer section, and with water in the rinsing section and OZASOL RC795™ gum in the gumming section.
The diptime in the developing solution was 22 seconds. Printing this material results in a good ink-uptake, runlength, dering and processing latitude.

| | Δ contact angle with 80% EP26 during 1' |
|---|---|
| Unexposed | 3° (105° -> 102°) |
| Exposed (240 mJ/cm2) | 35° (95° -> 60°) |

Exposing the material decreases the contact angle with 10°.

EXAMPLE 2

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m2 to form a surface topography with an average center-line roughness Ra of 0.5 μm.

After rinsing with demineralized water the aluminium foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an 30 aqueous solution containing 200 g/l of sulfuric acid at a temperature of 45° C., a voltage of about 10 V and a current density of 150 A/$m^2$ for about 300 seconds to form an anodic oxidation film of 3.00 g/$m^2$ of $Al_2O_3$ then washed with demineralized water, posttreated with a solution containing polyvinylphosphonic acid and subsequently with a solution containing aluminum trichloride, rinsed with demineralized water at 20° C. during 120 seconds and dried.

Preparation of the Heat-mode Imaging Element

The IR-sensitive layer was coated from a 6.65% wt. solution in tetrahydrofuran/2-methoxypropanol 60/40 at 21 μm wet coating thickness resulting in a dry coating thickness of 1.24 g/$m^2$. The resulting IR-sensitive layer contained: 9.1% of carbon black, 10.3% of 3,4,5-trimethoxybenzoic acid, 78.5% of ALNOVOL PN430™, 0.2% SOLSPERSE 5000™, 0.9% SOLSPERSE 28000™ (both dispersing agents from Zeneca Specialities, GB), 1.0% nitrocellulose E950.

Results

The change in contact angle with OZASOL EP26™ developer/water 4/1 ratio (OZASOL EP26™ is commercially available from Agfa) at the unexposed areas over a period of 1 minute is 8°.

The thus obtained material is insufficiently resistant to the developer, which results in a worse dotrendering and inferior processing latitude as compared to example 1.

EXAMPLE 3

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m2 to form a surface topography with an average center-line roughness Ra of 0.5 μm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 A/$m^2$ for about 300 seconds to form an anodic oxidation film of 3.00 g/$m^2$ of $Al_2O_3$ then washed with demineralized water, posttreated with a solution containing polyvinylphosphonic acid and subsequently with a solution containing aluminum trichloride, rinsed with demineralized water at 20° C. during 120 seconds and dried.

Preparation of the Heat-mode Imaging Element

The IR-sensitive layer was coated from a 6.65% wt. solution in tetrahydrofuran/2-methoxypropanol 60/40 at 21 μm wet coating thickness resulting in a dry coating thickness of 1.24 g/m$^2$. The resulting IR-sensitive layer contained 8.9% of carbon black, 10.1% of 3,4,5-trimethoxybenzoic acid, 76.9% of ALNOVOL PN430™, 0.2% SOLSPERSE 5000™, 0.9% SOLSPERSE 28000™, 0.9% nitrocellulose and 2.1% FLUORAD FC431™.

Exposing the Heat-mode Imaging Element

This material was imaged with a CREO 3244 TRENDSETTER™ external drum platesetter at 190 mJ/cm2 and 2400 dpi.

Results

| | Δ contact angle with 80% EP26 during 1' |
|---|---|
| Unexposed | 1° (111° -> 110°) |
| Exposed 190 mJ/cm$^2$ | 12° (106° -> 94°) |

Exposing the material decreases the contact angle with 5°.

The thus obtained printing element shows an unacceptable clean-out resulting in toning on press and inferior processing latitude as compared to example 1.

What is claimed is:

1. A heat mode imaging element for making a lithographic printing plate having on a lithographic base with a hydrophilic surface a first layer including a polymer soluble in an aqueous alkaline solution and in absence of an onium salt or a quinonediazide compound, and a top layer on the same side of the lithographic base as the first layer that is IR-sensitive and unpenetrable for an aqueous alkaline developer wherein said first layer and said top layer may be one and the same layer; characterized in that the surface of said element upon exposure and treatment with an aqueous alkaline developer is such that a) the contact angle between the unexposed areas of the imaging element and the aqueous alkaline developer changes for at most 6° during the first minute of contact with said developer;

b) the contact angle between the exposed areas of the imaging element and the aqueous alkaline developer changes more than 15° during the first minute of contact with said developer;

c) the difference in contact angle between on the one side the unexposed areas and on the other side the exposed areas of the imaging element with the aqueous alkaline solution at the onset of the measurement is not higher than 10°.

2. A heat mode imaging element for making a lithographic printing plate having on a lithographic base with a hydrophilic surface a first layer including a polymer soluble in an aqueous alkaline solution and a top layer on the same side of the lithographic base as the first layer that is IR-sensitive and unpenetrable for an aqueous alkaline developer; characterized in that the surface of said element upon exposure and treatment with an aqueous alkaline developer is such that a) the contact angle between the unexposed areas of the imaging element and the aqueous alkaline developer changes for at most 6° during the first minute of contact with said developer;

b) the contact angle between the exposed areas of the imaging element and the aqueous alkaline developer changes more than 15° during the first minute of contact with said developer;

c) the difference in contact angle between on the one side the unexposed areas and on the other side the exposed areas of the imaging element with the aqueous alkaline solution at the onset of the measurement is not higher than 10°.

3. A heat mode imaging element for making a lithographic printing plate according to claim 1 or 2 wherein the contact angle between the unexposed areas of the imaging element and the aqueous alkaline solution at the onset of the measurement is at least 100°.

4. A heat mode imaging element for making a lithographic printing plate according to claim 1 or 2 wherein the change in contact angle between the exposed areas of the imaging element and the aqueous alkaline developer during the first minute of contact is more than 20°.

5. A heat mode imaging element for making a lithographic printing plate according to claim 1 or 2 wherein the polymer soluble in an aqueous alkaline solution is a novolac polymer or a polymer containing polyhydroxy-styrene units.

6. A heat mode imaging element for making a lithographic printing plate according to claim 1 or 2 wherein the top layer contains a compound selected from the group consisting of low molecular acids and benzophenones.

7. A heat mode imaging element for making a lithographic printing plate according to claim 1 or 2 wherein the lithographic base is an electrochemically grained and anodized aluminum.

8. A heat mode imaging element for making a lithographic printing plate according to claim 1 or 2 wherein said imaging element contains an IR absorbing compound.

9. A method for making a lithographic printing plate comprising the steps of a) exposing imagewise to IR-radiation a heat mode imaging element according to claim 1 or 2; and b) developing said imagewise exposed heat mode imaging element with an aqueous alkaline developer whereby the exposed areas of the first and the top layer, which may be the same, are dissolved and the unexposed areas of the first layer remain undissolved.

10. A method for making a lithographic printing plate according to claim 9 wherein said aqueous alkaline developer contains alkalimetalsilicates and has a pH of at least 12.

11. A method for making a lithographic printing plate according to claim 9 wherein the laser exposure has a pixel dwell time between 0.005 and 20 μs.

* * * * *